(12) United States Patent
Kurd et al.

(10) Patent No.: US 6,670,833 B2
(45) Date of Patent: Dec. 30, 2003

(54) MULTIPLE VCO PHASE LOCK LOOP ARCHITECTURE

(75) Inventors: Nasser A. Kurd, Hillsboro, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 10/052,264

(22) Filed: Jan. 23, 2002

(65) Prior Publication Data

US 2003/0137328 A1 Jul. 24, 2003

(51) Int. Cl.[7] .................................. H03L 7/06
(52) U.S. Cl. ................... 327/156; 327/162; 375/376; 331/DIG. 2
(58) Field of Search ................ 327/146–148, 327/155–157, 162, 163; 375/373–376; 331/1 A, DIG. 2, 177 R (56) References Cited

U.S. PATENT DOCUMENTS

| | | | |
|---|---|---|---|
| 4,868,513 A | * 9/1989 | Piercy et al. | 327/156 |
| RE34,317 E | * 7/1993 | Ikeda | 331/25 |
| 5,572,167 A | * 11/1996 | Alder et al. | 331/2 |
| 5,592,113 A | 1/1997 | Quiet et al. | 327/158 |
| 5,686,864 A | * 11/1997 | Martin et al. | 331/1 A |
| 5,815,041 A | 9/1998 | Lee et al. | 331/8 |
| 5,825,210 A | 10/1998 | Oh | 327/12 |
| 5,909,130 A | 6/1999 | Martin et al. | 327/12 |
| 6,320,424 B1 | 11/2001 | Kurd et al. | 327/8 |

* cited by examiner

Primary Examiner—Minh Nguyen
(74) Attorney, Agent, or Firm—LeMoine Patent Services, PLLC (57) ABSTRACT

A VCO phase lock loop system may include a first voltage controlled oscillator that provides a first oscillation signal relative to a first frequency and a second voltage controlled oscillator that provide a second oscillation signal relative to a second frequency. A loop filter capacitor may be associated with both the first voltage controlled oscillator and the second voltage controlled oscillator. A selection device may enable components associated with the either one of the voltage controlled oscillators while disabling components associated with the other one of the voltage controlled oscillators.

16 Claims, 5 Drawing Sheets

MULTIPLE VCO PHASE LOCK LOOP ARCHITECTURE

FIELD

The present invention relates to phase-lock loop circuits. More particularly, the present invention relates to a multiple voltage controlled oscillator phase-locked loop architecture.

BACKGROUND

Phase-lock loops (PLL) may include a phase-frequency detector (PFD) that provides control signals indicative of a phase difference between a reference clock signal and a feedback clock signal such as a VCO clock of a voltage controlled oscillator (VCO). A charge pump may convert a digital output of the PFD to an analog current (or signal), which may then be integrated by a loop filter to generate a control voltage. The VCO may provide an oscillation signal responsive to the voltage signal.

Advancement in technology scaling is pushing the frequencies over which integrated circuits (such as microprocessors) are operating. At the same time, smaller and smaller feature sizes are causing much higher leakage devices. For this reason, a loop filter capacitance may be implemented using metal wire capacitance. The area of this capacitance may be much larger than previous generations. The area of the loop filter may be about 90 percent of the PLL area. To support a wide frequency range (from very low frequency to very high range) and at the same time achieving optimized performance without further increasing the area or the complexity of the clock generation, multiple PLLs may be utilized each operating at a specific range. However, multiple PLLs using multiple loop filters may require a large area as well as exponentially increase the complexity of the clock generation.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

SUMMARY

A phase lock loop system includes a phase frequency detector, first frequency components, second frequency components, and a loop filter capacitor. The first frequency components include a first voltage controlled oscillator, a first bias circuit, and a first charge pump. The second frequency components include a second voltage controlled oscillator, a second bias circuit, and a second charge pump. The loop filter capacitor is associated with the first and second voltage controlled oscillators. The loop capacitor is coupled to a first node between the first bias circuit and the first charge pump, and is coupled to a second node between the second bias circuit and the second charge pump.

DETAILED DESCRIPTION

In the following detailed description, like reference numerals and characters may be used to designate identical, corresponding or similar components in different figure drawings. While the present invention may be described with respect to example circuits, the implementation of these circuits may be accomplished in any one of several ways, including but not limited to logic circuits and circuit elements provided within a microchip or integrated circuit. Each of these implementations is within the scope of the present invention. Further, the circuit designs may have many variations of the circuit components that can perform the various functions. Each of these variations are within the scope of the present invention.

Embodiments of the present invention may also be described with respect to signals being input or output from different circuit components. It is understood that while the discussion identifies a signal, the signal may be transmitted over a signal line such as that shown in the drawings. Further, the terminology signal may also correspond to a signal line as shown in the drawings. Additionally, well-known power/ground and address connections to components may not be shown within the Figures for simplicity of illustration and discussion, and so as not to obscure the invention.

Embodiments of the present invention may be described with respect to a phase lock loop system that includes a first voltage controlled oscillator (and its associated bias circuit, charge pump circuit and half replica circuit) and a second voltage controlled oscillator (and its associated bias circuit, charge pump circuit and half replica circuit). The first voltage controlled oscillator and the second voltage controlled oscillator may share a loop filter capacitor as will be described below. The first voltage controlled oscillator and it's associated components may be tuned to a first frequency and the second voltage controlled oscillator and it's associated components may be tuned to a second frequency. An enabling/disabling mechanism may operate to enable the first voltage controlled oscillator by enabling components associated with the first voltage controlled oscillator and to disable the second voltage controlled oscillator by disabling components associated with the second voltage controlled oscillator. The enabling/disabling mechanism may further enable the second voltage controlled oscillator by enabling components associated with the second voltage controlled oscillator and to disable the first voltage controlled oscillator by disabling components associated with the first voltage controlled oscillator.

Figure 1:
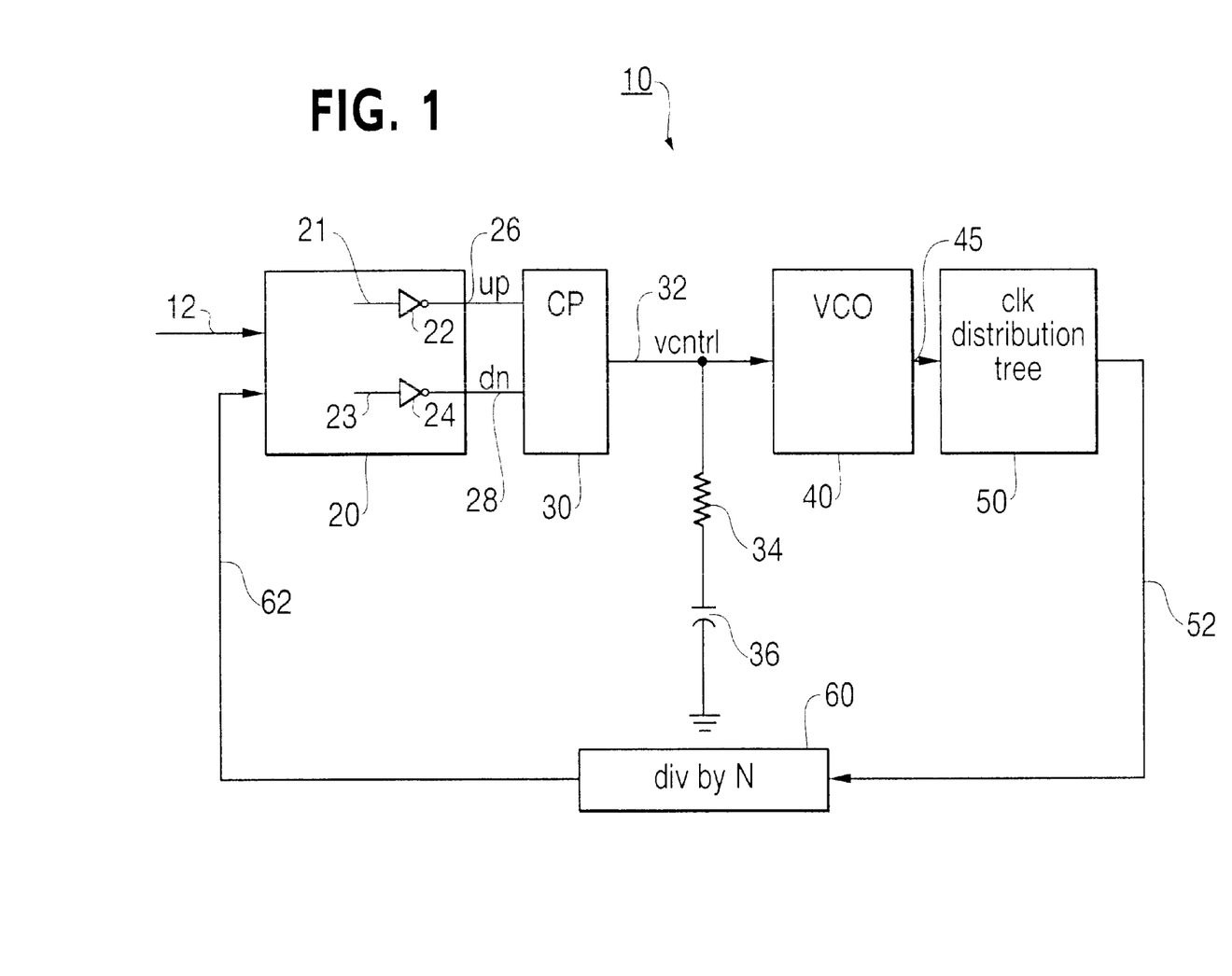
FIG. 1 shows an example clocking system.

FIG. 1 shows a clocking system 10 that includes a phase frequency detector (PFD) 20, a charge pump (CP) 30, a voltage-controlled oscillator (VCO) 40, a clock distribution tree 50 and a divide-by-N counter 60. A reference clock signal 12 is applied to an input of the phase frequency detector 20. The reference clock signal 12 may be provided by an external clocking source. That is, the clocking source may be external to a microchip or integrated circuit containing the clocking system 10. A feedback clock signal 62 may also be applied to an input of the phase frequency detector 20. The phase frequency detector 20 generates a signal 21 and a signal 23 based on the reference clock signal 12 and the feedback clock signal 62. The signal 21 is applied to an input of an inverter circuit 22 that provides an up signal 26. The signal 23 is applied to an input of an inverter circuit 24 that provides a down signal 28. The up signal 26 and the down signal 28 are applied to input terminals of the charge pump 30. That is, the phase frequency detector 20 compares the phase of the reference clock signal 12 and the feedback clock signal 62 and provides the up signal 26 and the down signal 28 to input terminals of the charge pump 30. The up and down signals 26, 28 indicate respective positive and negative charge directions for the charge pump 30. The charge pump 30 converts the digital inputs (i.e., produces a voltage control signal 32 based on the up and down signals 26 and 28) to an analog current (or signal) that is then integrated by a loop filter to generate a control voltage signal 32. The voltage control signal 32 is applied to the VCO 40 for varying the frequency of the VCO clock signal 45 that is input to the clock distribution tree 50.

The clock distribution tree 50 produces a signal 52 that is applied to the divide-by-N counter 60 that in turn produces the feedback clock signal 62. The signal 52 produced by the clock distribution tree 50 also becomes the clock signal that will be input to the state machines on the microchip or integrated circuit. As discussed above, the feedback clock signal 62 is applied to an input of the phase frequency detector 20.

A filter, such as a second order filter, may also be provided between the charge pump 30 and the voltage-controlled oscillator 40. The second order filter may include a resistor 34 and a capacitor 36 coupled to ground. Other types of filters may also be used. The up signal 26 and the down signal 28 charges or discharge the capacitor 36. This, in turn, decreases or increases the voltage of the voltage control signal 32 applied to the VCO 40. The VCO 40 determines the frequency output of the VCO clock signal 45. Stated differently, the up signal 26 and the down signal 28 are used to determine the frequency output of the VCO 40.

The phase frequency detector 20 generates the phase difference between the up signal 26 and the down signal 28 to be substantially equal to the phase difference between the reference clock signal 12 and the feedback clock signal 62. In particular, the phase difference of the reference clock signal 12 and the feedback signal 62 is copied and realized by the difference in the duration of the up signal 26 and the down signal 28. When the feedback clock signal 62 is slower than the reference clock signal 12 (i.e., the feedback clock signal is lagging), then the duration of the up signal 26 may be larger than the duration of the down signal 28. This increases the frequency of the VCO clock signal 45. On the other hand, when the VCO clock signal 45 is faster than the reference clock signal 12 (i.e., the feedback clock signal is leading), then the duration of the down signal 28 may be larger than the duration of the up signal 26. This decreases the frequency of the VCO clock signal 45.

Figure 2:
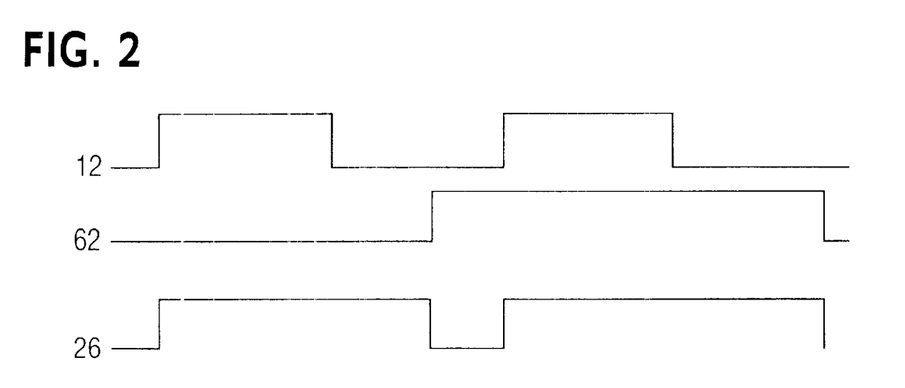
FIG. 2 is a timing diagram of signals shown in FIG. 1.

FIG. 2 shows a timing diagram of three signals shown in FIG. 1. In this example, the up signal 26 may be produced (i.e., go high) upon a leading edge of the reference clock signal 12. The up signal 26 may remain high until a leading edge of the feedback clock signal 62.

Figure 3:
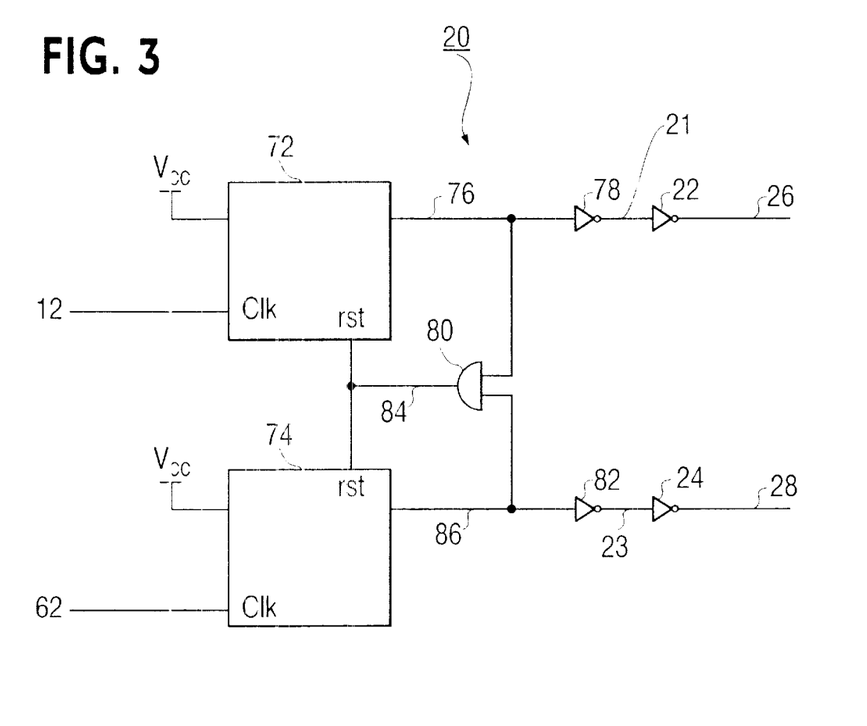
FIG. 3 shows the phase-frequency detector from FIG. 1.

FIG. 3 shows components of the phase frequency detector 20 shown in FIG. 1. The phase frequency detector 20 may include a first flip flop circuit 72 and a second flip flop circuit 74. Each of the flip-flop circuits 72 and 74 may be a D-type of flip flop circuit in which the D inputs are connected to a high voltage ($V_{cc}$). The reference clock signal 12 may be applied to a clock input of the first flip flop circuit 72 and the feedback clock signal 62 may be applied to a clock input of the second flip flop circuit 74. The first flip flop circuit 72 produces a signal 76 that is applied to an input of an inverter circuit 78. The inverter circuit 78 produces the signal 21 that is applied to an input of the inverter circuit 22 that in turn produces the up signal 26. The signal 76 is also applied to a first input of an AND gate 80.

The second flip flop circuit 74 produces a signal 86 that is applied to an input of an inverter circuit 82. The inverter circuit 82 produces the signal 23 that is applied to an input of the inverter circuit 24 that in turn produces the down signal 28. The signal 86 is also applied to a second input of the AND gate 80.

The AND gate 80 performs a logical AND operation on the signal 76 and the signal 86 to produce a reset signal 84. The reset signal 84 is applied to a reset input of both the first flip flop circuit 72 and the second flip-flop circuit 74.

Figure 4:
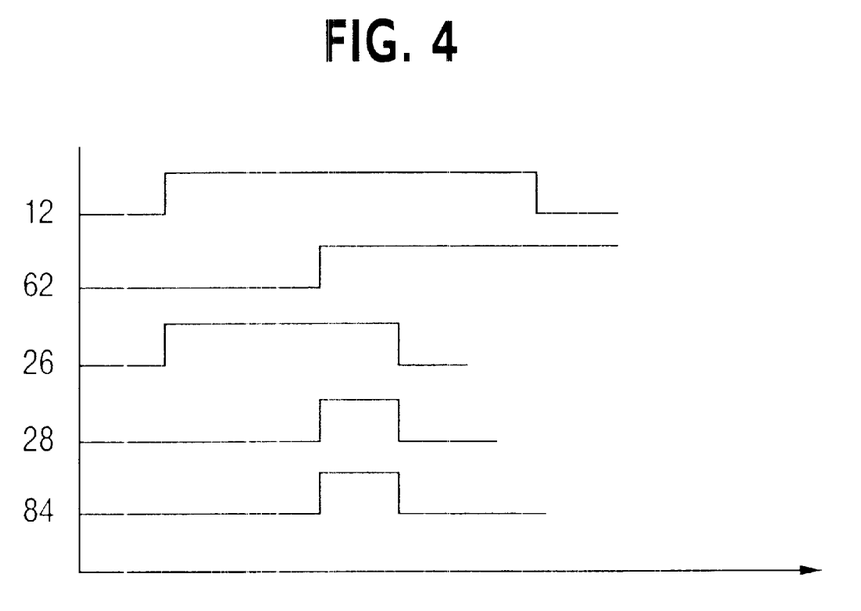
FIG. 4 is a timing diagram of signals shown in FIG. 3.

FIG. 4 shows a timing diagram of signals shown in FIG. 3. In this Figure, the reference clock signal 12 is shown as leading the feedback clock signal 62. Accordingly, the up signal 26 may go high at the leading edge of the reference clock signal 12 and remain high until the feedback clock signal 62 is detected. The down signal 28 may be produced (i.e., go high) upon the leading edge of the feedback clock signal 62. FIG. 4 also shows the reset signal 84 that is produced when both the up signal 26 and the down signal 28 are high.

Figure 5:
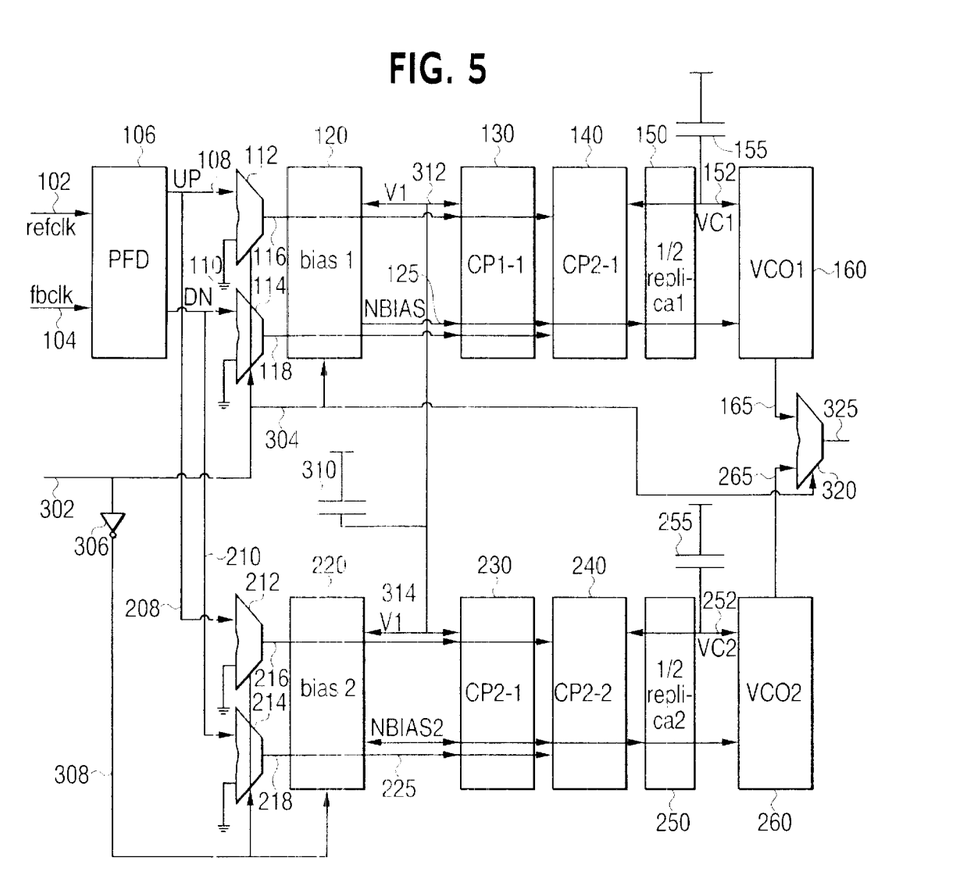
FIG. 5 illustrates a PLL architecture having dual VCOs according to an example embodiment of the present invention.

FIG. 5 illustrates a PLL architecture having dual VCOs for a multiple VCO PLL architecture according to an example embodiment of the present invention. Other embodiments and configurations are also within the scope of the present invention. In a dual VCO PLL architecture, one VCO (and its associated components) may be tuned to operate at a high frequency and the other VCO (and its associated components) may be tuned to operate at a low frequency. More particularly, FIG. 5 shows a PFD 106 that receives a reference clock (REFCLK) signal on a signal line 102 and receives a feedback clock (FBCLK) signal on a signal line 104. Similar to that described above with respect to FIG. 1, the reference clock signal may be provided by an external clocking source. That is, the clocking source may be external to a microchip or integrated circuit containing the dual VCO PLL architecture. The PFD 106 may generate two signals (namely an UP signal and a DOWN signal) based on a phase difference between the REFCLK signal on the signal line 102 and the FBCLK signal on the signal line 104. That is, the PFD 106 may output an UP signal on a signal line 108 and/or a DOWN signal on a signal line 110 based on the phase difference.

The UP signal on the signal line 108 may be applied to a first input of a multiplexer 112. A second input of the multiplexer 112 may be coupled to ground. The multiplexer 112 may output a UPD1 signal on a signal line 116 based on a select signal input to the multiplexer 112, as will be described below. Similarly, the DOWN signal on the signal line 110 may be applied to a first input of a multiplexer 114. A second input of the multiplexer 114 may be coupled to ground. The multiplexer 114 may output a DND1 signal on a signal line 118 based on a select signal input to the multiplexer 114, as will be described below.

The UPD1 signal on the signal line 116 may be input to a first charge pump circuit (CP1-1) 130 and to a second charge pump circuit (CP2-1) 140. Similarly, the DND1 signal on the signal line 118 may be input to the first charge pump circuit 130 and to the second charge pump circuit 140. One skilled in the art will understand that while FIG. 5 shows two charge pump circuits associated with each VCO, embodiments of the present invention are also applicable to a single charge pump or more than two charge pumps being associated with each VCO. FIG. 5 additionally shows a half replica circuit 150 that produces a PBIAS1 signal on a signal line 152. The PBIAS1 signal may be applied along the signal line 152 to the VCO 160. A bias circuit 120 may also be coupled to provide an NBIAS1 signal on a signal line 125 to the first charge pump circuit 130, the second charge pump circuit 140, the half replica circuit 150 and the VCO 160. More specifically, the bias circuit 120 generates the NBIAS1 signal based on the voltage V1 on the signal line 312. The half replica circuit 150 may also receive the NBIAS1 signal and generate a replica of the voltage V1, which is the PBIAS1 signal. Both the PBIAS1 signal and the NBIAS1 signal may be used by the VCO 160 to synthesize the frequency. The charge pumps 130, 140 may also receive the NBIAS1 signal since this is a self biased PLL in which the currents are relative to each other. The NBIAS1 signal applied to the charge pumps 130, 140 may be used to control the amount of charge/discharge of a loop filter. The VCO 160 receives the PBIAS1 signal along the signal line 152 (shown as VC1) and receives the NBIAS1 signal along the signal line 125. A capacitor 155 may be coupled between a high voltage source (Vcc) and the signal line 152 (on which the PBIAS1 signal is provided).

FIG. 5 also shows a loop filter capacitor 310 provided between a high voltage source (Vcc) and the signal line 312 that is applied both to the bias circuit 120 and to the first charge pump circuit 130 (shown as V1). The loop filter capacitor 310 integrates the charge pump output and thus reduces ripple and provides a stable signal voltage V1 which then gets replicated by the ½ replica to the VC1 signal and is applied to the VCO 160. Additionally, the loop filter bandwidth determines how the PLL responds to any phase error.

The PFD 106 also outputs the UP signal on a signal line 208 and/or the DOWN signal on a signal line 210. The UP signal on the signal line 208 may be applied to a first input of a multiplexer 212. A second input of the multiplexer 212 may be coupled to ground. The multiplexer 212 may output a UPD2 signal on a signal line 216 based on a select signal input to the multiplexer 212, as will be described below. Similarly, the DOWN signal on the signal 210 may be applied to a first input of a multiplexer 214. A second input of the multiplexer 214 may be coupled to ground. The multiplexer 214 may output a DND2 signal on a signal line 218 based on a select signal input to the multiplexer 214, as will be described below.

The UPD2 signal on the signal line 216 may be input to a first charge pump circuit (CP2-1) 230 and to a second charge pump circuit (CP2-2) 240. Similarly, the DND2 signal on the signal line 218 may be input to the first charge pump circuit 230 and to the second charge pump circuit 240. FIG. 5 additionally shows a half replica circuit 250 that produces a PBIAS2 signal on a signal line 252. The PBIAS2 signal may be applied along the signal line 252 to the VCO 260. A bias circuit 220 may also be coupled to provide an NBIAS2 signal on a signal line 225 to the first charge pump circuit 230, the second charge pump circuit 240, the half replica circuit 250 and the VCO 260. More specifically, the bias circuit 220 generates the NBIAS2 signal based on the voltage V1 on the signal line 314. The half replica circuit 250 may also receive the NBIAS2 signal and generate a replica of the voltage V1, which is the PBIAS2 signal. Both the PBIAS2 signal and the NBIAS2 signal may be used by the VCO 260 to synthesize the frequency. The charge pumps 230, 240 may also receive the NBIAS2 signal since this is a self biased PLL in which the currents are relative to each other. The NBIAS2 signal applied to the charge pumps 230, 240 may be used to control the amount of charge/discharge of the loop filter. The VCO 260 receives the PBIAS2 signal along the signal line 252 (as shown on VC2) and receives an NBIAS2 signal along the signal line 225. A capacitor 255 may be coupled between a high voltage source (Vcc) and the signal line 252 (on which the PBIAS2 signal is provided).

The loop filter capacitor 310 is provided also between a high voltage source (Vcc) and the signal line 314 that is applied both to the bias circuit 220 and to the first charge pump circuit 230 (shown as V1). Similar to that discussed above, the loop filter capacitor 310 integrates the charge pump output and thus reduces ripple and provides a stable signal voltage VI which then gets replicated by the ½ replica to the VC2 signal and is applied to the VCO 260. Additionally, the loop filter bandwidth determines how the PLL responds to any phase error.

FIG. 5 additionally shows a signal line 302 that receives an ENABLE/DISABLE signal. The ENABLE/DISABLE signal (or complements of that signal) may be applied to various components of the dual VCO PLL architecture. That is, a state (such as HIGH or LOW) of the ENABLE/DISABLE signal may be used to enable or disable portions of the dual PLL architecture. The ENABLE/DISABLE signal may be provided from on-chip or off-chip. An example of an on-chip delivery is based on the frequency target in which the chip may be programmed to operate and that could be set/programmed and stored on the die (such as by using a fuse) and which in turn may set the enable. Another example of determining the ENABLE/DISABLE signal may be decoding the ratio that determines the frequency and setting the ENABLE/DISABLE signal accordingly. This may also be done externally of the system.

The ENABLE/DISABLE signal on the signal line 302 may be provided as a select signal to each of the multiplexers 112 and 114. The ENABLE/DISABLE signal on the signal line 302 may also be provided along a signal line 304 to the bias circuit 120. The ENABLE/DISABLE signal may also be provided along the signal line 302 to an input of an inverter circuit 306 that provides a DISABLE/ENABLE signal along a signal line 308. The state of the DISABLE/ENABLE signal on the signal line 308 may thereby be the complement of the state of the ENABLE/DISABLE signal on the signal line 304. The DISABLE/ENABLE signal on the signal line 308 may be provided as a select signal to each of the multiplexers 212 and 214. The DISABLE/ENABLE signal on the signal line 308 may also be provided to the bias circuit 220.

The ENABLE/DISABLE signal on the signal line 302 may also be provided along the signal line 304 to a select input of a multiplexer 320. The multiplexer 320 receives an output signal from the VCO 160 along a signal line 165 and receives an output signal for the VCO 260 along a signal line 265. The multiplexer 320 thereby outputs a signal along a signal line 325 based on a select input signal.

In the following example, the VCO 160 may be the low frequency VCO and the VCO 260 may be the high frequency VCO. In this configuration, each of the VCOs may have it's own circuit components to produce the associated frequency for the output clock signal. The low frequency VCO may have its own bias circuit, its own charge pump circuits and its own half replica circuit. The high frequency VCO may also have its own bias circuit, its own charge pumps and its own half replica circuit. However, according to embodiments of the present invention, the VCOs (such as the VCO 160 and the VCO 260) may share a loop filter capacitor (such as the capacitor 310) and a PFD (such as the PFD 106). In the FIG. 5 embodiment, the VCO 160, the bias circuit 120, the first charge pump circuit 130 and the second charge pump circuit 140 may be tuned to operate at lower frequencies. Additionally, the VCO 260, the bias circuit 220, the first charge pump circuit 230 and the second charge pump circuit 240 may be tuned to operate at higher frequencies.

One of the VCO's (either the VCO 160 or the VCO 260) may be enabled based on the desired frequency. This may be done based on the ENABLE/DISABLE signal on the signal line 302. In one example, the components associated with the VCO 160 may be enabled by a HIGH signal on the signal line 302. In this situation, the circuitry associated with the VCO 260 may receive a DISABLE signal (i.e., a LOW signal) that disables circuit components associated with the VCO 260. In contrast, the components associated with the VCO 260 may be enabled by a LOW signal on the signal line 302. In this situation, the circuitry associated with the VCO 160 may receive a DISABLE signal (i.e., a LOW signal) that disables circuit components associated with the VCO 160.

When one VCO is enabled, then the other VCO may be completely disabled such that it does not contribute any noise or current to the enabled VCO. The outputs of the PFD 106 may be muxed such that the disabled VCO may have the UP/DOWN signals deasserted (by use of the corresponding multiplexers) and such that no charge/discharge occurs through the corresponding charge pump. The ENABLE/DISABLE signal may also enable/disable the respective bias circuit as shown by the ENABLE/DISABLE signal input to the bias circuit 120 along the signal line 302 and the DISABLE/ENABLE signal input to the bias circuit 220 along the signal line 308. When one VCO is disabled, then a differential amplifier (not shown in FIG. 5) in the respective bias circuit may be disabled, which thereby forces the NBIAS signal (either NBIAS 1 or NBIAS2) to go LOW. The NBIAS signal may be applied to a half-replica circuit to generate the PBIAS (either PBIAS1 or PBIAS2) signal such as at the signal line 152 or the signal line 252. Both the NBIAS signal and the PBIAS signal may be applied to the respective VCO to prevent the VCO from oscillating. For example, if the ENABLE signal on the signal line 302 is HIGH, then the DISABLE/ENABLE signal to the circuit component along the signal line 308 may be LOW. In this example, the VCO 160 may be enabled and the VCO 260 may be disabled. For the VCO 160, the NBIAS signal on the signal line 125 and the PBIAS1 signal on the signal line 152 may reach their steady state after the PLL has locked. However, for the VCO 260, the NBIAS2 signal on the signal line 225, the UPD2 signal on the signal line 216 and the DND2 signal line 218 may be held low. Thus, the PBIAS signal on the signal line 252 may go high and prevent the VCO 260 oscillating.

Figure 6:
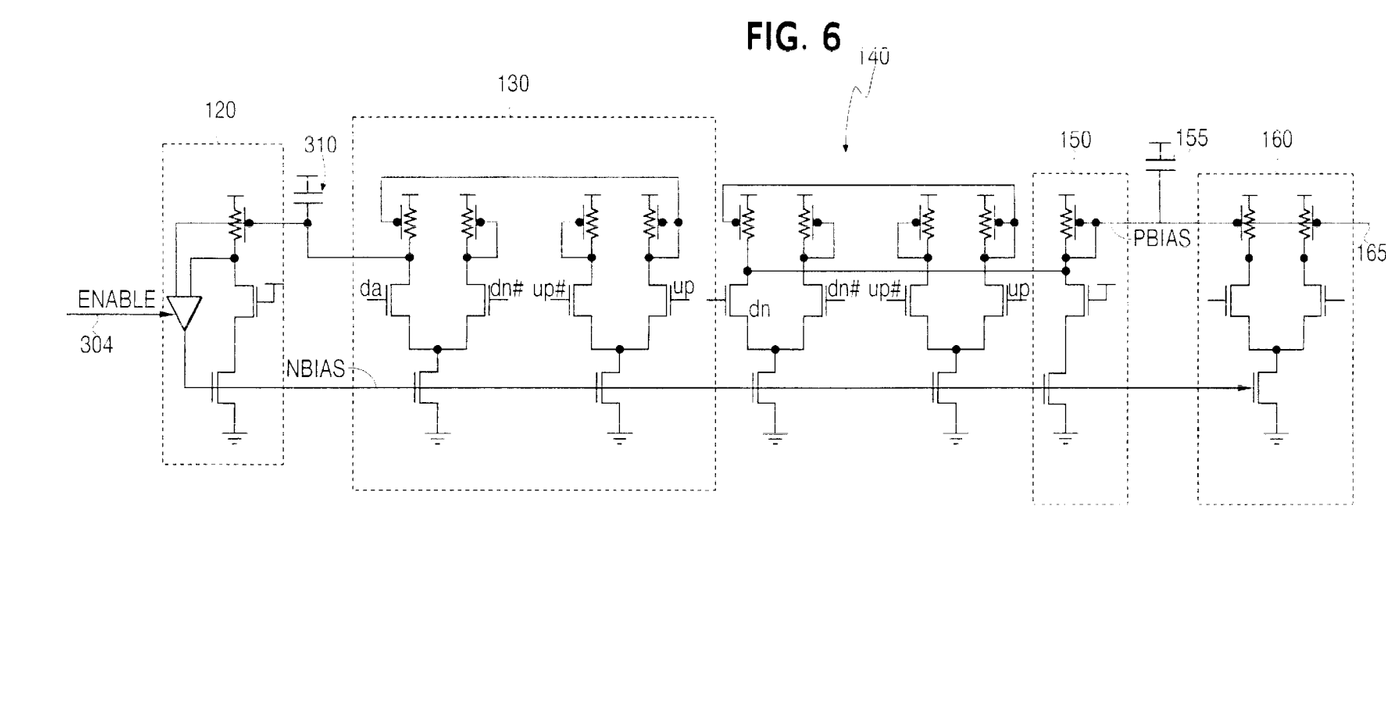
FIG. 6 is a circuit diagram of a bias circuit, two charge pump circuits, a half-replica circuit and a VCO according to an example embodiment of the present invention.

FIG. 6 is a circuit diagram of a bias circuit, two charge pump circuits, a half replica circuit and a VCO according to an example embodiment of the present invention. Other embodiments and configurations are also within the scope of the present invention. More specifically, FIG. 6 shows the bias circuit 120, the first charge pump circuit 130, the second charge pump circuit 140, the half replica circuit 150 and the VCO 160 from FIG. 5. Although not shown, a similar arrangement may be provided for the bias circuit 220, the first charge pump circuit 230, the second charge pump circuit 240, the half replica circuit 250 and the VCO 260. FIG. 6 shows one example way in which the ENABLE/DISABLE signal may be applied on the signal line 304 to a differential amplifier of the bias circuit 120. FIG. 5 further shows the loop filter capacitor 310 coupled between a high voltage source (Vcc) and a node between the bias circuit 120 and the first charge pump circuit 130. This node corresponds to the voltage V1. The capacitor 155 is also coupled between a high voltage source (Vcc) and a node between the half replica circuit 150 and the VCO 160. This node corresponds to the PBIAS1 signal that is applied to an input of the VCO 160. FIG. 6 additionally shows the formation of the NBIAS1 signal and its input to the first charge pump circuit 130, the second charge pump circuit 140, the half replica circuit 150 and the VCO 160. The VCO 160 outputs an oscillation signal on the signal line 165 based on the PBIAS1 signal and the NBIAS1 signal.

As shown in FIG. 6, the first charge pump circuit 130 receives the digital UP/DN signals (from the PFD 106) and converts them into two analog current signals that charge or discharge the loop filter so as to generate the V1 signal. The amount of current may be proportional to the VCO delay elements current. The second charge pump circuit 140 provides the resistance for the loop filter for every up and down event.

Embodiments of the present invention have been described with respect to a phase lock loop system that includes first frequency components (including a first voltage controlled oscillator) to output a first oscillation signal and second frequency components (including a second voltage controlled oscillator) to output a second oscillation signal. A selection device may enable the first frequency components and disable the second frequency components. The selection device may also enable the second frequency component and disable the first frequency components.

Increased demand for higher frequency and wider operating ranges while maintaining optimum performance through the entire range may thereby utilize multiple VCOs each optimized for a specific range. By sharing the loop filter (such as the capacitor 310), a PLL may be designed and built with multiple VCOs each tuned and selected for a certain range. In addition to enabling a wider range, currently, for debug and burn in, additional external clocks may be applied to thereby bypass the PLL since the PLL does not operate at these ranges.

Embodiments have been described with respect to two VCOs in a PLL architecture. Embodiments of the present invention are also applicable to more than two VCOs. In such circumstances, more than one ENABLE/DISABLE signal may be used and additional circuitry may be used to determine which VCO is to be enabled.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A phase lock loop system comprising:
   a phase frequency detector;
   first frequency components coupled to the phase frequency detector and including a first voltage controlled oscillator, a first bias circuit and a first charge pump;
   second frequency components coupled to the phase frequency detector and including a second voltage controlled oscillator, a second bias circuit and a second charge pump; and
   a loop filter capacitor associated with both said first voltage controlled oscillator and said second voltage controlled oscillator, said loop filter capacitor coupled to a first node between said first bias circuit and said first charge pump, and said loop filter capacitor coupled to a second node between said second bias circuit and said second charge pump;
   wherein the first frequency components include a half replica circuit coupled to and associated with said first voltage controlled oscillator.

2. The phase lock loop of claim 1, wherein said first voltage controlled oscillator provides a first oscillation signal relative to a first frequency and said second voltage controlled oscillator provides a second oscillation signal relative to a second frequency.

3. The phase lock loop system of claim 1, wherein said loop filter capacitor is coupled to said first bias circuit, and said first bias circuit to produce a first output signal.

4. The phase lock loop system of claim 3, wherein said half replica circuit is coupled to one input of said first voltage controlled oscillator, said half replica circuit to provide a second output signal to said first voltage controlled oscillator.

5. The phase lock loop system of claim 4, wherein said first voltage controlled oscillator produces an oscillation signal based on said first output signal and said second output signal.

6. The phase lock loop system of claim 1, wherein the first voltage controlled oscillator receives a first bias signal and a second bias signal to synthesize a frequency.

7. A phase lock loop system comprising:
   a phase frequency detector;
   first frequency components coupled to the phase frequency detector and including a first voltage controlled oscillator, a first bias circuit and a first charge pump;
   second frequency components coupled to the phase frequency detector and including a second voltage controlled oscillator, a second bias circuit and a second charge pump;
   a loop filter capacitor associated with both said first voltage controlled oscillator and said second voltage controlled oscillator, said loop filter capacitor coupled to a first node between said first bias circuit and said first charge pump, and said loop filter capacitor coupled to a second node between said second bias circuit and said second charge pump; and
   an enabling/disabling device to receive at least one select signal, the enabling/disabling device to enable the first frequency components and disable the second frequency components when the select signal is in a first state, said enabling disabling device to further enable the second frequency components and to disable the first frequency components when the select signal is in a second state.

8. The phase lock loop system of claim 7, wherein the enabling/disabling device enables the first bias circuit and disables the second bias circuit in the first state of the select signal, and the enabling/disabling device disables the first bias circuit and enables the second bias circuit in the second state of the select signal.

9. The phase lock loop system of claim 7, wherein the first frequency components further include a multiplexer device coupled to the first charge pump, and the enabling/disabling device to control an output of the multiplexer device such that the first charge pump receives a LOW input signal from the multiplexer device when the select signal is in the second state.

10. The phase lock loop system of claim 7, if wherein a state of the select signal is based on a desired frequency.

11. A phase lock loop system comprising:
    a phase frequency detector;
    first frequency components coupled to the phase frequency detector and including a first voltage controlled oscillator, a first bias circuit and a first charge pump;
    second frequency components coupled to the phase frequency detector and including a second voltage controlled oscillator, a second bias circuit and a second charge pump;
    a loop filter capacitor associated with both said first voltage controlled oscillator and said second voltage controlled oscillator, said loop filter capacitor coupled to a first node between said first bias circuit and said first charge pump, and said loop filter capacitor coupled to a second node between said second bias circuit and said second charge pump;
    wherein the first voltage controlled oscillator receives a first bias signal and a second bias signal to synthesize a frequency; and
    wherein when an enabling/disabling device disables the first bias circuit, said first bias circuit outputs a LOW signal as the second bias signal, and said first voltage controlled oscillator receives said LOW signal as the second bias signal and a HIGH signal as the first bias signal so as to prevent oscillation of the first voltage controlled oscillator.

12. The phase lock loop system of claim 11, wherein said first voltage controlled oscillator provides a first oscillation signal relative to first frequency and said second voltage controlled oscillator provides a second oscillation signal relative to a second frequency.

13. The phase lock loop system of claim 11, wherein said loop filter capacitor is coupled to said first bias circuit, and said first bias circuit to produce a first output signal.

14. A phase lock loop system comprising:
    a phase frequency detector;

first frequency components coupled to the phase frequency detector and including a first voltage controlled oscillator, a first bias circuit and a first charge pump;

second frequency components coupled to the phase frequency detector and including a second voltage controlled oscillator, a second bias circuit and a second charge pump; and a loop filter capacitor associated with both said first voltage controlled oscillator and said second voltage controlled oscillator, said loop filter capacitor coupled to a first node between said first bias circuit and said first charge pump, and said loop filter capacitor coupled to a second node between said second bias circuit and said second charge pump;

wherein the phase lock loop system is provide on a chipset, and the chipset receives a select signal from a source external to the chipset to select a desired one of the voltage controlled oscillators.

15. The phase lock loop system of claim 14, wherein said first voltage controlled oscillator provides a first oscillation signal relative to a first frequency and said second voltage controlled oscillator provides a second oscillation signal relative to a second frequency.

16. The phase lock loop system of claim 14, wherein a state of the select signal is based on a desired frequency.

* * * * *

UNITED STATES PATENT AND TRADEMARK OFFICE
CERTIFICATE OF CORRECTION

PATENT NO. : 6,670,833 B2
DATED : December 30, 2003
INVENTOR(S) : Nasser Kurd and Ian Young It is certified that error appears in the above-identified patent and that said Letters Patent is hereby corrected as shown below:

Column 10,
Line 12, delete "enabling disabling" and insert -- enabling/disabling --, therefor.
Line 29, delete "if".

Signed and Sealed this

Eighteenth Day of May, 2004

JON W. DUDAS
*Acting Director of the United States Patent and Trademark Office*